(12) United States Patent
Kudelka et al.

(10) Patent No.: US 6,677,197 B2
(45) Date of Patent: Jan. 13, 2004

(54) HIGH ASPECT RATIO PBL SIN BARRIER FORMATION

(75) Inventors: Stephan Kudelka, Ottendorf-Okvilla (DE); Helmut Horst Tews, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/032,040

(22) Filed: Dec. 31, 2001

(65) Prior Publication Data

US 2003/0124805 A1 Jul. 3, 2003

(51) Int. Cl.[7] ............... H01L 21/8242; H01L 21/20; H01L 21/44
(52) U.S. Cl. .............. 438/245; 438/244; 438/387; 438/388; 438/653; 438/643; 438/627
(58) Field of Search ........................... 257/301–304, 257/376, 394–400; 438/243, 278–272, 643, 627, 653, 244–249, 386–392, 430–435

(56) References Cited

U.S. PATENT DOCUMENTS

| | | | |
|---|---|---|---|
| 5,236,862 A | 8/1993 | Pfiester et al. | 437/70 |
| 5,393,692 A | 2/1995 | Wu | 437/69 |
| 5,985,737 A | 11/1999 | Wu | 438/448 |
| 6,008,103 A | 12/1999 | Hoepfner | 438/386 |
| 6,140,175 A | 10/2000 | Kleinhenz | 438/243 |
| 6,153,902 A | 11/2000 | Furukawa et al. | 257/301 |
| 6,238,974 B1 | 5/2001 | Chern et al. | 438/255 |
| 6,271,079 B1 | 8/2001 | Wei et al. | 438/243 |
| 6,284,666 B1 | 9/2001 | Naeem et al. | 438/713 |
| 6,331,459 B1 | 12/2001 | Gruening | 438/243 |
| 6,452,224 B1 * | 9/2002 | Mandelman et al. | 257/296 |
| 6,498,061 B2 * | 12/2002 | Divakaruni et al. | 438/243 |

OTHER PUBLICATIONS

Pfiester, J.R., et al. "Nitride–Clad LOCOS Isolation for 0.25 $\mu$m CMOS," Advanced Products Research and Development Laboratory, Motorola Inc., pp. 139–140.

* cited by examiner

*Primary Examiner*—Caridad Everhart
*Assistant Examiner*—Calvin Lee
(74) *Attorney, Agent, or Firm*—Slater & Matsil, LLP

(57) ABSTRACT

In a process for preparing a DT DRAM for sub 100 nm groundrules that normally require the formation of a collar after the bottle formation, the improvement of providing a collar first scheme by forming a high aspect ration PBL SiN barrier, comprising:

a) providing a semiconductor structure after SiN node deposition and DT polysilicon fill;
b) depositing a poly buffered LOCOS (PBL) Si liner;
c) subjecting the PBL liner to oxidation to form a pad oxide and depositing a SiN barrier layer;
d) depositing a silicon mask liner;
e) subjecting the DT to high directional ion implantation (I/I) using a p-dopant;
f) employing a selective wet etch of unimplanted Si with an etch stop on SiN;
g) subjecting the product of step f) to a SiN wet etch with an etch stop on the pad oxide;
h) affecting a Si liner etch with a stop on the pad oxide;
i) oxidizing the PBL Si liner and affecting a barrier SiN strip;
j) providing a DT polysilicon fill and performing a poly chemical mechanical polishing.

20 Claims, 3 Drawing Sheets

HIGH ASPECT RATIO PBL SIN BARRIER FORMATION

BACKGROUND OF THE INVENTION

1. Field of the Invention

The present invention relates to formation of high aspect ratio poly buffered LOCOS (PBL) SiN barrier, and more particularly, to high aspect ratio PBL SiN barrier formations for deep trench (DT) DRAMS of sub 100 nm groundrules.

2. Description of the Prior Art

In the fabrication of deep trench (DT) DRAM processes for sub 100 nm groundrules a collar must be made after the bottle formation, surface enhancement, buried plate doping, node deposition and DT conductor fill. However, in the case of a collar first process scheme, the DT CD (critical dimension) for the required fill processes is not sufficient to allow proper fill of materials, such as thicker node dielectrics or hemispherical grained (HSG) polysilicon layers for surface enhancement.

In a collar first process scheme, the process needs a deposited collar scheme that involves use of a reactive ion etching (RIE) open process in order to open the collar at the bottom of the recessed DT. This is the most critical step since sub 100 nm DT CD leads to aspect ratios of >40:1 for RIE processes.

U.S. Pat. No. 6,153,902 discloses a vertical DRAM cell with wordline self-aligned to storage trench. In this DRAM device, the substrate has a top surface and a trench with a sidewall formed in the substrate. A signal storage node is formed using a bottom portion of the trench and a signal transfer device is formed using the upper portion of the trench. The signal transfer device includes a first diffusion region coupled to the signal storage node and extending from the sidewall of the trench into the substrate, a second diffusion region formed in the substrate adjacent to the top surface of the substrate and adjacent to the sidewall of the trench, a channel region extending along the sidewall of the trench between the first diffusion region and the second diffusion region, a gate insulator formed along the sidewall of the trench extending from the first diffusion region to the second diffusion region, a gate conductor filling the trench and having a top surface, and a wordline having a bottom adjacent the top surface of the gate conductor and a side aligned with the sidewall trench.

As may be seen from FIG. 5 thereof, the exposed oxide is etched using reactive ion etching (RIE).

A method for forming a DRAM cell in a semiconductor substrate is disclosed in U.S. Pat. No. 6,331,459 B1. The method includes forming an electrode for the capacitor in a lower portion of a trench in the semiconductor substrate. A sacrificial material is formed on the sidewall portion of the trench, such sacrificial material extending from the surface of the semiconductor substrate into the substrate beneath the surface of the semiconductor substrate. The active area for the transistor is delineated and includes forming a covering material over the surface of the semiconductor substrate with a portion of the sacrificial material projecting through the covering material to expose such portion of the sacrificial material. Subsequent to the delineation of the active area, the covering material and the exposed portion of the sacrificial material are subjected to an etch to selectively remove the sacrificial material while leaving the covered material, such removed sacrificial material exposing the first region of the semiconductor substrate disposed beneath the surface of such substrate.

As may be seen from FIG. 1C, the structure may be subjected to reactive ion etching (RIE) to remove horizontal surface portions of the polycrystalline silicon which remained on the lower surface of the recess while leaving vertical regions of such polycrystalline silicon material and vertical portions of the silicon nitride layer.

U.S. Pat. No. 6,008,103 disclose a method for forming trench capacitors in an integrated circuit. The method comprises:

forming a trench within a semiconductor body, said trench having a trench interior surface;

forming an oxide collar within said trench, said oxide collar covering a first portion of said trench interior surface, leaving a second portion of said trench interior surface uncovered with said oxide collar;

thereafter, doping said second portion of said trench interior surface with a first dopant using a plasma-enhanced doping process, said plasma-enhanced doping process being configured to cause said first dopant to diffuse into said second portion substantially without depositing an additional layer on said trench interior surface; and driving said first dopant into said semiconductor body using a high temperature process.

As may be seen from FIG. 10A, the trench may be etched in the substrate using any suitable etch process, including RIE.

U.S. Pat. No. 6,271,079 B1 discloses a method of forming a trench capacitor. The method entails:

providing a silicon substrate;

patterning said silicon substrate to form a trench region in said substrate;

forming a silicon oxide layer on said silicon substrate and in said trench region;

etching said silicon oxide layer to a first level, wherein a portion of said silicon oxide layer is remaining in said trench region, whereby a portion of a trench sidewall of said trench region is exposed;

forming a collar oxide on said portion of said trench sidewall;

forming a silicon nitride sidewall on said collar oxide;

removing said portion of said silicon oxide layer in said trench region to expose a bottom portion of said trench region;

etching said bottom portion of said trench region to form a fresh trench region, wherein said process is done by said silicon nitride sidewall as a barrier;

doping ions over said fresh trench region to form a bottom cell plate;

removing said silicon nitride sidewall;

forming a dielectric film along a surface of said bottom cell plate, said collar oxide, and said silicon substrate;

forming a first conductive layer on said dielectric film and refilling in said trench region;

etching said first conductive layer to a second level to form a storage node of said trench capacitor and exposing a portion of said collar oxide;

etching said exposed dielectric film and portion of said collar oxide;

forming a second conductive layer on said first conductive layer; and etching back said second conductive layer to a third level to form a buried strap in said trench region.

As may be seen from FIG. 2, the etching step to form the deep trench region may be conducted by reactive ion etching (RIE).

A method of eliminating or at least minimizing RIE lag during the manufacture of DTs in DRAM devices or similar memory structures having a large aspect ratio (i.e., >30:1) is disclosed in U.S. Pat. No. 6,284,666. Further, it teaches an etching process that prevents the formation of a sidewall film to an extent where it hinders further removal of material from a DT. Also, it teaches a process of forming a film to an extent that is necessary to prevent isotropic etching of a substrate, hence maintaining the required profile and the shape of a DT within a semiconductor substrate. Lastly, it provides a method of using RIE and wet etching in an alternate process referred to as cyclic etch process, wherein a controlled thickness of a film is maintained to achieve a predetermined DT depth for high aspect ratio structures.

U.S. Pat. No. 5,236,862 discloses an integrated circuit device formed by providing a semiconductor substrate. A first buffer layer is formed overlying the substrate. A masking layer is formed overlying the first buffer layer. The masking layer is patterned to form an exposed portion of the first buffer layer and to leave a remaining portion of the masking layer overlying the substrate and to define an isolation region of the substrate. The exposed portion of the first buffer layer is etched to form a recess under an edge portion of the remaining portion of the masking layer and to form an exposed portion of the substrate and to leave a remaining portion of the buffer layer overlying the substrate. A second buffer is formed overlying the exposed portion of the substrate. A nitride layer is formed overlying the remaining portion of the masking layer and the second buffer layer wherein the nitride layer substantially fills the recess, and the nitride layer is oxidized to form an oxidized layer and to form electrical isolation in the isolation region of the substrate.

Reduction of the bird's beak length of the field oxide isolation region that occurs when using the LOCOS technique to form field isolation regions in integrated circuits, without adding significant processing complexity is disclosed in U.S. Pat. No. 5,393,692.

The process also provides a more planar topography than prior art techniques and thus meets lithography requirements for sub-micron processing and also reduces the problem of polyline necking.

U.S. Pat. No. 6,140,175 discloses a structure and process which enables the trench storage capacitor and array pass transistor to be formed aligned with each other, using the same masking level in the array, and thus enables an improvement in manufacturing tolerance of the DRAM. It further discloses lining the trench with an insulator and filling the trench with a conductor to form a deep trench storage device and forming a conductive strap between the deep trench storage device and the gate conductor.

A method for forming an isolation region in an integrated circuit is disclosed in U.S. Pat. No. 5,985,737, and comprises:

forming a pad layer on a semiconductor substrate;
forming an oxidation masking layer on the pad layer, the pad layer relieving stress from the oxidation masking layer;
patterning to etch the oxidation masking layer and pad layer to expose a portion of the substrate;
laterally removing the pad layer to form at least one undercut under the oxidation masking layer;
conformably forming a doped layer on the oxidation masking layer, the pad layer, and the substrate, thereby refilling at least one undercut with the doped layer;
anisotropically etching the doped layer to form spacers on sidewalls of the oxidation masking layer and the pad layer;
and thermally oxidizing the substrate to form the isolation region in the substrate, wherein a plurality of doping atoms in the doped layer diffuse into the substrate.

U.S. Pat. No. 6,238,974 B1 discloses a process of fabricating bottom electrode for memory cell capacitor of DRAM devices having greatly increased electrode surface area by providing a generally curved electrode surface in combination with a coarse surface characteristic.

The process includes forming an insulation layer on the surface of the substrate of the device, patterning the insulation layer to form a contact opening exposing a source/drain region of the transistor of the memory cell. A first electrically conductive layer is formed covering the insulation layer and further filling, into the contact opening, with the first electrically conductive layer contacting the exposed source/drain region. A native oxide layer is then formed on the surface of the first electrically conductive layer. A second electrically conductive layer is then formed, and is patterned to form a recess substantially located above the location of the contact opening, formed in the insulation layer. A layer of HSG-Si is formed over the surface of the second electrically conductive layer and the surface of the recess, and the HSG-Si layer and the second electrically conductive layer are subsequently patterned to form the bottom electrode of the capacitor.

Accordingly, it is clear that, in a collar first scheme for a DT DRAM process for sub 100 nm groundrules, the DT CD for the required bill processes is not sufficient to allow proper fill of materials, such as thicker node dielectrics or HSG for surface enhancement, and a substitute or alternative process for the collar RIE process is needed.

SUMMARY OF THE INVENTION

In accordance with the present invention, a collar formation scheme is utilized in the place of the collar RIE process of deposited collar processes by a high directional ion implantation (I/I) process used for poly buffered LOCOS (PBL) formation. This deposit collar scheme, which is an alternative to a RIE process, is based on high directional ion implantation and high selectivity that can be achieved therewith due to p-dopants in the deposited Si liner processes.

BRIEF DESCRIPTION OF THE DRAWINGS

The foregoing process and the advantages attendant thereto will become more readily appreciated by reference to the following detailed description, when taken in conjunction with the accompanying drawings, wherein.

DETAILED DESCRIPTION OF PREFERRED EMBODIMENT OF INVENTION

Figure 1:
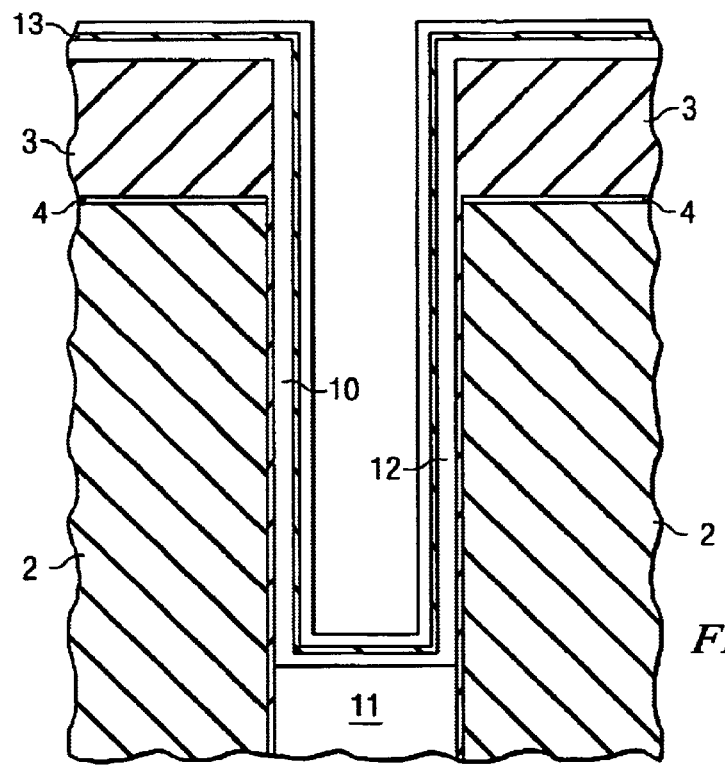
FIG. 1. depicts a stage in the invention process wherein, after SiN node deposition and DT polysilicon fill, a poly buffered LOCOS (PBL) Si liner is deposited, and thereafter, pad oxidation plus a SiN barrier layer is deposited, following which a Si mask liner is deposited.

Referring now to FIG. 1, it can be seen that a stage in the invention process is depicted wherein after deposition of a SiN node 10 and DT polysilicon fill 11, a poly buffered LOCOS (PBL) Si liner 12 is deposited, preferably at a thickness of about 150 Å. Thereafter, an oxidation of the SiN liner is affected to form a pad oxide/SiN barrier 13. Next, a Si mask liner (not shown) is deposited in a thickness of about less than or equal to, preferably, 100 Å. This brings the total stack structure to a thickness of about 300 Å. At this point, the structure comprises a Si bulk 2, the polysilicon fill 11 a SiN layer 3 and a SiO film 4.

Figure 2:
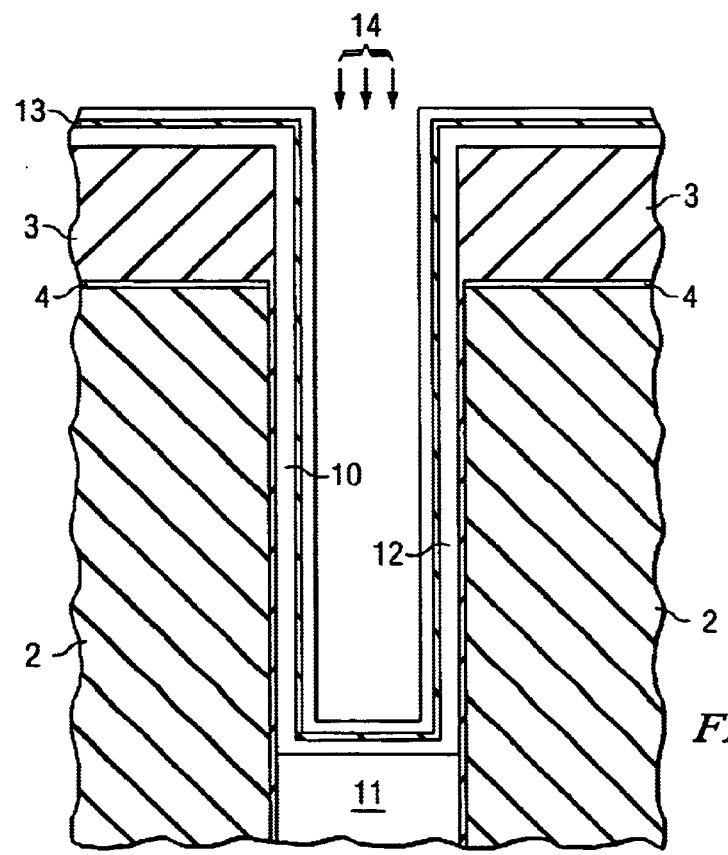
FIG. 2 depicts a stage in the invention process in which there is straight ion implantation of p-dopant.

The stack structure from FIG. 1 is next subjected to straight or high directional ion implantation (I/I), as is shown in FIG. 2. The straight ion implantation 14 of a p-dopant is affected, preferably with $BF_2$ at a concentration of from about $1-5 \times 10^{13}$ ions/cm$^2$.

Figure 3:
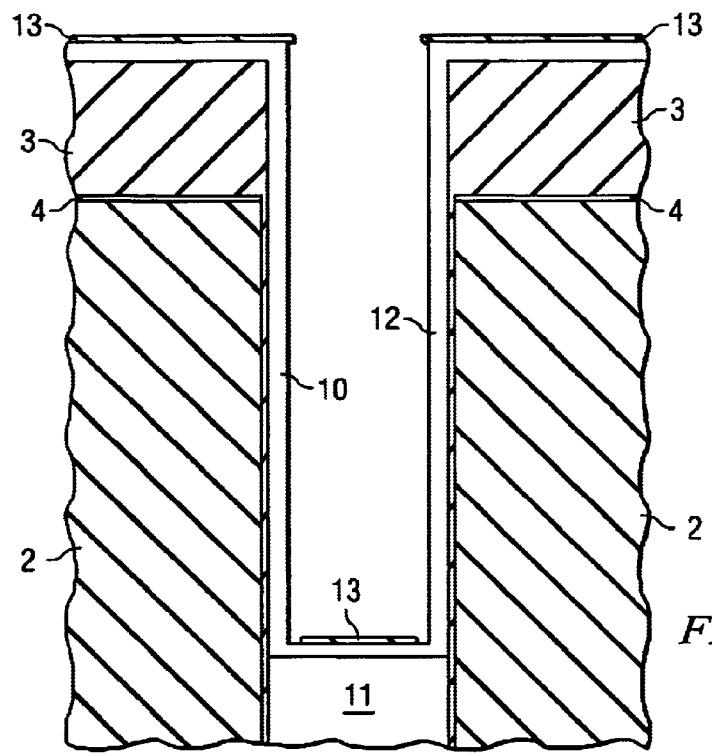
FIG. 3 depicts a stage in the invention process wherein there is selective wet etch of unimplanted Si with etch stop on SiN, followed by a SiN wet etch stop on the pad oxide, after which there is a residual Si liner etch with stop on the pad oxide.

The stacked structure of FIG. 2, as shown in FIG. 3 is first subjected to a selective wet etch of unimplanted Si, preferably using $NH_4OH$ with an etch stop on SiN liner 12. The SiN liner 12 is then subjected to a wet etch, preferably using $H_3PO_4$ with an etch stop on the pad oxide/SiN barrier 13. Thereafter, a residual Si liner etch is affected with an etch stop on the pad oxide to arrive at the structure shown in FIG. 3.

Figure 4:
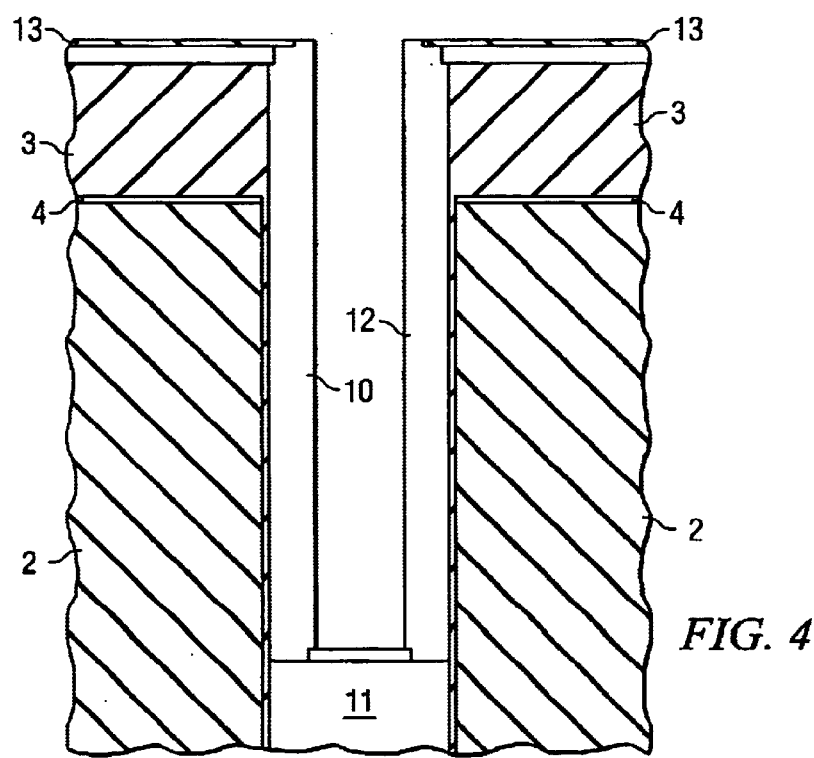
FIG. 4 depicts a stage in the invention process where oxidation of the PBL Si liner is affected, followed by a barrier SiN stripping.

The structure from FIG. 3 is then subjected to oxidation of the PBL, Si liner 12 followed by a residual SiN barrier strip, preferably using HF or a mixture of HF and ethylene glycol to arrive at the structure shown in FIG. 4.

Figure 5:
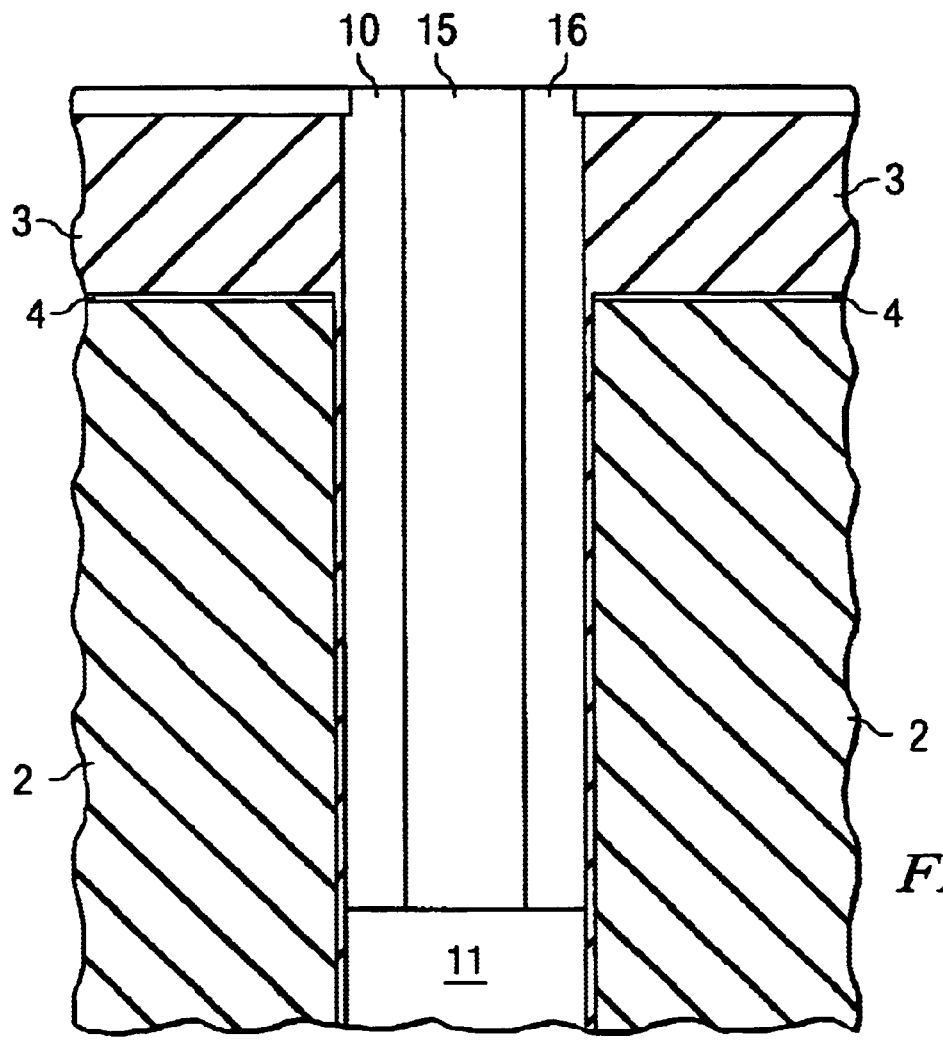
FIG. 5 depicts the concluding stage of the invention process in which there is DT polysilicon fill followed by poly chemical mechanical polishing (CMP).

The structure of FIG. 4 is then subjected to a DT polysilicon fill 15 followed by a poly chemical mechanical polishing (CMP) to provide the structure shown in FIG. 5, which includes a collar oxide 16.

We claim:

1. A process for preparing deep trench (DT) DRAM device, the process comprising:

providing a semiconductor region including a deep trench formed therein, wherein a lower portion of the deep trench is filled with polysilicon and sidewalls of an upper portion of the trench are lined with a SiN node layer;

depositing a silicon liner within the deep trench over the SiN node layer;

forming a pad oxide/SiN barrier layer over the silicon liner;

depositing a silicon mask liner over the pad oxide/SiN barrier layer;

subjecting a bottom portion of the deep trench to a high directional ion implantation, the high directional ion implantation being substantially parallel to the sidewalls of the deep trench;

employing a selective wet etch of unimplanted silicon with an etch stop on the SiN barrier layer;

employing a selective wet etch of the SiN barrier with an etch stop on the pad oxide;

oxidizing the silicon liner;

affecting a residual barrier SiN strip;

filling the upper portion of the deep trench with polysilicon; and performing a poly chemical mechanical polishing after filling the upper portion.

2. The process of claim 1 wherein depositing a silicon liner comprises depositing a poly buffered LOCOS (PBL) silicon liner.

3. The process of claim 2 wherein depositing a poly buffered LOGOS Si liner comprises depositing said PBL Si liner to a thickness of about 150 Å.

4. The process of claim 1 wherein subjecting the DT to a high directional ion implantation comprises implanting a p-type dopant.

5. The process of claim 4 wherein subjecting the DT to a high directional ion implantation comprises implanting $BF_2$.

6. The process of claim 5 wherein said high directional ion implantation is performed at $1-5 \times 10^{13}$ ions/cm$^2$.

7. The process of claim 5 wherein employing a selective wet etch of unimplanted Si is performed using $NH_4OH$.

8. The process of claim 1 wherein employing a selective wet etch of the SiN barrier is performed using $H_3PO_4$.

9. The process of claim 1 wherein affecting a residual barrier SiN strip is performed using HF.

10. The process of claim 9 wherein affecting a residual barrier SiN strip is performed using a mixture of HF and ethylene glycol.

11. A method of forming a semiconductor device, the method comprising:

providing a semiconductor structure including a trench formed therein, wherein a lower portion of the deep trench is filled with fill polysilicon;

depositing a silicon layer along sidewalls within an upper portion of the trench;

forming an oxide collar along the sidewalls of the upper portion of the trench but not along the fill polysilicon within the lower portion of the trench by oxidizing the silicon layer along the sidewalls within the upper portion of the trench; and filling the upper portion of the trench with polysilicon wherein the polysilicon in the upper portion of the trench abuts the polysilicon in the lower portion of the trench.

12. The method of claim 11 wherein depositing a silicon layer comprises depositing a poly buffered LOCOS silicon liner.

13. The method of claim 11 wherein forming an oxide collar comprises:

forming a pad oxide/SiN barrier layer over the silicon layer;

depositing a silicon mask liner over the pad oxide/SiN barrier layer;

subjecting a bottom portion of the trench to a high directional ion implantation, the high directional ion implantation being substantially parallel to the sidewalls of the trench;

employing a selective wet etch of unimplanted silicon with an etch stop on the SiN barrier layer;

employing a selective wet etch of the SiN barrier with an etch stop on the pad oxide; and oxidizing the silicon liner.

14. The process of claim 13 wherein subjecting the DT to a high directional ion implantation comprises implanting a p-type dopant.

15. The process of claim 14 wherein subjecting the DT to a high directional ion implantation comprises implanting $BF_2$.

16. The process of claim 15 wherein said high directional ion implantation is performed at $1-5 \times 10^{13}$ ions/cm$^2$.

17. The process of claim 13 wherein employing a selective wet etch of unimplanted Si is performed using $NH_4OH$.

18. The process of claim 13 wherein employing a selective wet etch of the SiN barrier is performed using $H_3PO_4$.

19. The process of claim 13 wherein affecting a residual barrier SiN strip is performed using HF.

20. The process of claim 19 affecting a residual barrier SiN strip is performed using a mixture of HF and ethylene glycol.

* * * * *

UNITED STATES PATENT AND TRADEMARK OFFICE
CERTIFICATE OF CORRECTION

PATENT NO. : 6,677,197 B2
DATED : January 13, 2004
INVENTOR(S) : Kudelka et al.

It is certified that error appears in the above-identified patent and that said Letters Patent is hereby corrected as shown below:

<u>Title page,</u>
Item [75], Inventors, "Ottendorf-Okvilla (DE)" should read -- Ottendorf-Okrilla (DE) --;

<u>Column 6,</u>
Line 21, "claim 5" should read -- claim 1 --; and

<u>Column 8,</u>
Line 5, insert -- wherein -- immediately following "claim 19".

Signed and Sealed this

Twentieth Day of April, 2004

JON W. DUDAS
*Acting Director of the United States Patent and Trademark Office*